United States Patent [19]

Umetsu

[11] Patent Number: 5,191,693
[45] Date of Patent: Mar. 9, 1993

[54] TAPE TYPE WORK CONVEYING METHOD AND CONVEYING APPARATUS

[75] Inventor: Sachio Umetsu, Kawasaki, Japan

[73] Assignee: Canon Kabushiki Kaisha, Tokyo, Japan

[21] Appl. No.: 635,872

[22] Filed: Dec. 28, 1990

[30] Foreign Application Priority Data

Dec. 29, 1989 [JP] Japan .................................. 1-341983
Dec. 29, 1989 [JP] Japan .................................. 1-341984

[51] Int. Cl.⁵ .................................................. B23P 11/00
[52] U.S. Cl. ............................... 29/429; 29/426.3;
29/709; 29/714; 156/324; 156/344; 156/350;
156/351; 156/584; 414/416; 414/786;
198/347.3; 198/803.14; 53/453
[58] Field of Search ................... 198/347.3, 803.14;
414/403, 411, 416, 417, 786; 29/740, 741, 426.3,
429, 709, 714; 53/51, 453, 454, 559, 560;
156/344, 350, 351, 584, 324

[56] References Cited

U.S. PATENT DOCUMENTS

| | | | |
|---|---|---|---|
| 4,575,995 | 3/1986 | Tabuchi et al. | 53/453 X |
| 4,606,117 | 8/1986 | Takahashi et al. | 29/740 |
| 4,740,136 | 4/1988 | Asai et al. | 414/416 X |
| 4,768,915 | 9/1988 | Fujioka | 29/740 X |
| 4,869,393 | 9/1989 | Soth | 221/72 X |
| 4,952,113 | 8/1990 | Fujioka | 414/416 |

FOREIGN PATENT DOCUMENTS 60-48855 3/1985 Japan .
64-84881 3/1989 Japan .
64-84882 3/1989 Japan .
64-84883 3/1989 Japan .
64-84884 3/1989 Japan .
64-84885 3/1989 Japan .

Primary Examiner—Joseph E. Valenza
Assistant Examiner—Tuan N. Nguyen
Attorney, Agent, or Firm—Fitzpatrick, Cella, Harper & Scinto

[57] ABSTRACT

A tape type work conveying method and apparatus conveys works placed in placing portions on a conveying tape to an opening surface portion, and causes a robot device to pick up or place works in synchronism with a parts assembling apparatus or a parts manufacturing apparatus. In the tape type work conveying apparatus, a cover tape is arranged to cover opening portions of the placing portions of the conveying tape. The tape type work conveying apparatus includes a first reel for fixing end portions of the conveying tape and the cover tape, a second reel for fixing an end portion of the conveying tape, a third reel for fixing an end portion of the cover tape, drive assemblies for respectively causing the first, second, and third reels to perform pivotal movements, an intermittent driver which drives the conveying tape, a controller for controlling the drive assemblies and the intermittent drives, and a first detector for detecting to-be-detected portions arranged near the opening surface portion and arranged at substantially the same intervals as the placing portions of the conveying tape. The works are picked up or placed while synchronizing the apparatuses on the basis of the detection result from the first detector.

11 Claims, 9 Drawing Sheets

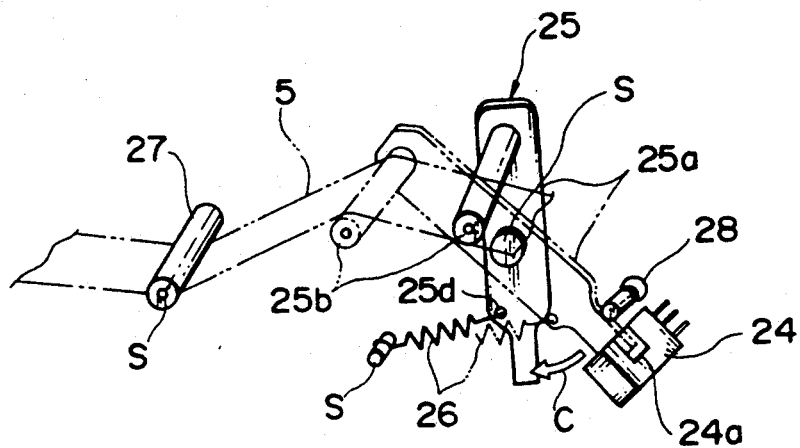
F I G. 2
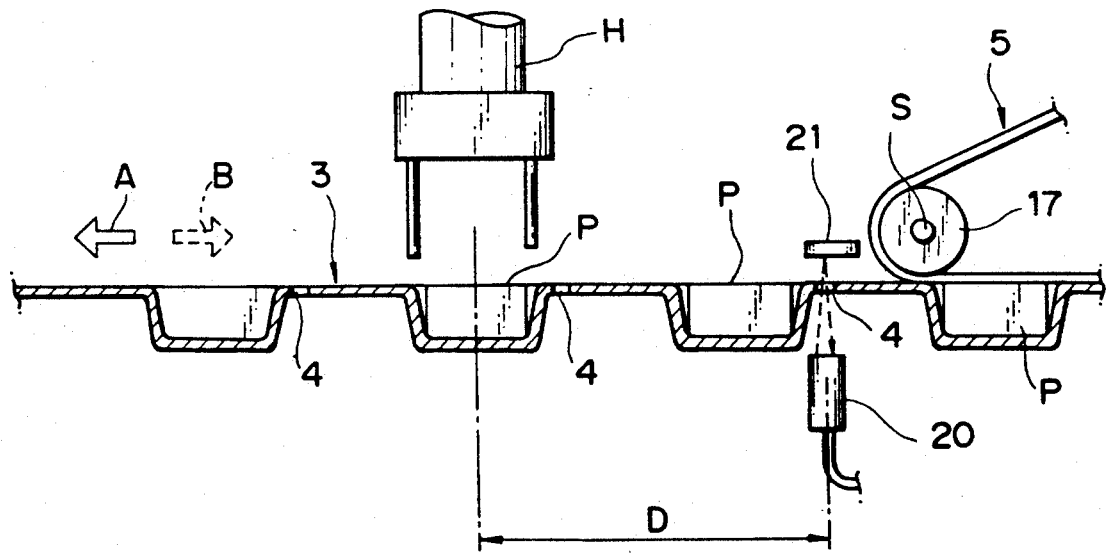
F I G. 3

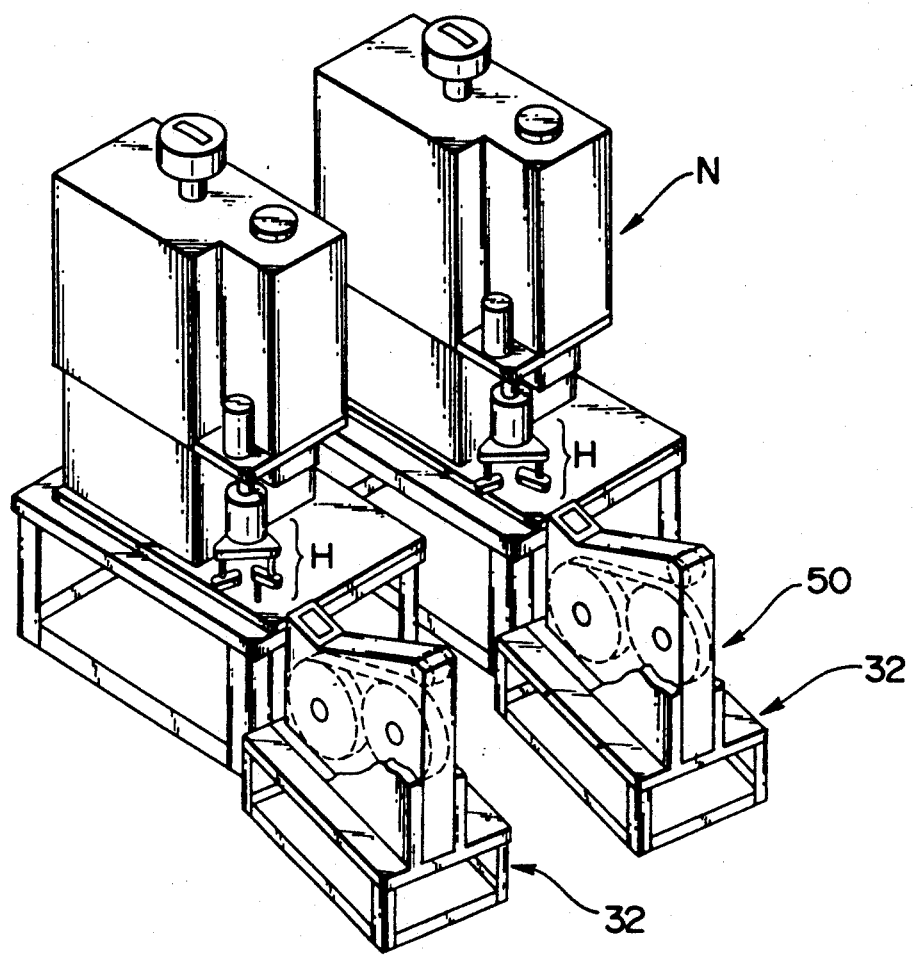
F I G. 7

TAPE TYPE WORK CONVEYING METHOD AND CONVEYING APPARATUS

BACKGROUND OF THE INVENTION

1. Field of the Invention

The present invention relates to a tape type work conveying method and apparatus, which intermittently conveys works by utilizing a continuous strip-like tape.

2. Description of the Prior Art

Various automatic assembling apparatuses have been proposed along with progress in factory automation. These automatic assembling apparatuses have technical subjects of quickly and reliably feeding works (parts) to be assembled at low cost.

More specifically, as a most popular conventional parts feeding method to an automatic assembling apparatus, a pallet system is employed. In this system, a parts carrying pallet is prepared in correspondence with outer shapes, weights, materials, and the like of parts to be fed. Parts are aligned and placed on the pallet in advance, and thereafter, the pallet is conveyed to a predetermined position. The parts are sequentially picked up from the pallet and are assembled by the automatic assembling apparatus. The pallet system is effective for relatively large parts. However, since small parts such as screws are too small and too many for the pallet system, it is difficult to apply the pallet system to these parts.

Even if the pallet system is applied to small parts such as screws, it is cumbersome and difficult to place them on a pallet while aligning their directions.

In consideration of the above drawbacks, a vibration type parts feeder system is often employed. In this system, small parts such as screws are randomly stored in a case, the case is vibrated to align the directions of the parts, and the parts can be fed one by one.

However, in both the pallet system and the vibration type parts feeder system, when a plurality of kinds of parts are to be fed, pallets or vibration type parts feeders corresponding to the outer shapes of individual parts to be fed must be prepared.

A cassette type parts feeding apparatus which can solve the above drawback is proposed in Japanese Laid-Open Patent No. 60-48855 entitled "Parts Feeding Apparatus". In this apparatus, parts are clamped between tapes arranged in a cassette to be successively stored in the cassette.

According to this proposal, however, a pick-up operation by, e.g., a robot hand equipped in an assembling apparatus cannot be performed. Repetitively adhereable tapes suffer from an adhesion limit, and must be exchanged when the adhesion limit is exceeded. In addition, the tape is slackened when it is taken up around a reel, and cannot reliably feed parts. Furthermore, since the presence/absence of parts cannot be detected, fully automatic robot hand operations cannot be performed.

The present applicant proposed a "tape type work conveying apparatus" in Japanese Patent Application Nos. 1-84881, 1-84882, 1-84883, 1-84884, and 1-84885, thereby eliminating drawbacks of the "work feeding apparatus" in Japanese Laid-Open Patent No. 60-48855 described above, and allowing fully automatic robot hand operations.

However, according to the "tape type work conveying apparatus" of the present applicant, tape drive control and work count control necessary for picking up and placing works are performed by a control means connected to a main controller of a parts assembling apparatus or a parts manufacturing apparatus comprising a robot hand, and a storage capacity of the main controller is undesirably increased, resulting in an expensive tape type work conveying apparatus.

Since the main controller detects an initial state by an initialization operation, the apparatus cannot be automatically started after a power switch is turned on.

A conveying force of each tape is controlled by setting a tension of the tape on the basis of drive control of a special-purpose motor arranged for each reel. Therefore, it is particularly difficult to perform control for preventing a cover tape from being slackened, and the cover tape is undesirably slackened.

SUMMARY OF THE INVENTION

The present invention has been made in consideration of the above-mentioned problems, and has as its object to provide an inexpensive tape type work conveying method and apparatus for performing tape drive control and work count control necessary for picking up and placing works.

It is another object of the present invention to provide a tape type work conveying method and apparatus, which can be automatically started after a power switch is turned on.

It is still another object of the present invention to provide a tape type work conveying method and apparatus which can attain fully automatic robot hand operations capable of reliably conveying works while preventing a cover tape from being slackened.

In order to achieve the above objects, a tape type work conveying method and apparatus according to the present invention, comprises: a tape conveying apparatus comprising a conveying tape having a plurality of successive placing portions for placing and conveying works, a cover tape for covering openings of the placing portions of the conveying tape, a first reel for fixing end portions of the conveying tape and the cover tape and simultaneously taking up the conveying tape and the cover tape, a second reel for fixing an end portion of the conveying tape and taking up only the conveying tape, a third reel for fixing an end portion of the cover tape and taking up only the cover tape, drive assemblies for respectively causing the first, second, and third reels to perform predetermined pivotal movements, intermittent drive means which is locked with successive guide holes formed in the conveying tape and intermittently drives the conveying tape, control means for controlling the drive assemblies and the intermittent drive means, an opening surface portion for picking up and placing the works placed in the placing portions of the conveying tape, first detection means for detecting to-be-detected portions arranged near the opening surface portion and arranged at substantially the same intervals as the placing portions of the conveying tape, and guiding/positioning means for a parts assembling apparatus or a parts manufacturing apparatus, each of the parts assembling apparatus and the parts manufacturing apparatus further comprising a main controller connected to the control means, and a robot hand. The method includes the step of picking up or placing works while synchronizing the tape conveying apparatus and the parts assembling apparatus or the parts manufacturing apparatus on the basis of a detection result of the first detection means.

The tape conveying apparatus preferably comprises a conveying tape having a plurality of successive placing portions for placing and conveying works, a cover tape for covering openings of the placing portions of the conveying tape, a first reel for fixing end portions of the conveying tape and the cover tape and simultaneously taking up the conveying tape and the cover tape, a second reel for fixing an end portion of the conveying tape and taking up only the conveying tape, a third reel for fixing an end portion of the cover tape and taking up only the cover tape, drive assemblies for respectively causing the first, second, and third reels to perform predetermined pivotal movements, intermittent drive means which is locked with successive guide holes formed in the conveying tape and intermittently drives the conveying tape, control means for controlling the drive assemblies and the intermittent drive means, an opening surface portion for picking up and placing the works placed in the placing portions of the conveying tape, and tape slack detection means which is operated when the cover tape is slackened, wherein the pivot control of the third reel is performed on the basis of a detection signal from the tape slack detection means.

In order to achieve the above objects, various other changes and modifications may be made within the scope of the claims.

BRIEF DESCRIPTION OF THE DRAWINGS

FIG. 2 is a perspective view showing another structure of an actuator 25;

FIG. 3 is a sectional view showing a state wherein detection holes 4 are detected at a position corresponding to an operation reference position of a robot hand H;

FIG. 7 is a perspective view showing a state wherein the tape type work conveying apparatus 50 is set in a parts manufacturing apparatus N comprising the robot hand H;

DESCRIPTION OF THE PREFERRED EMBODIMENT

A preferred embodiment of the present invention will be described below with reference to the accompanying drawings.

Figure 1:
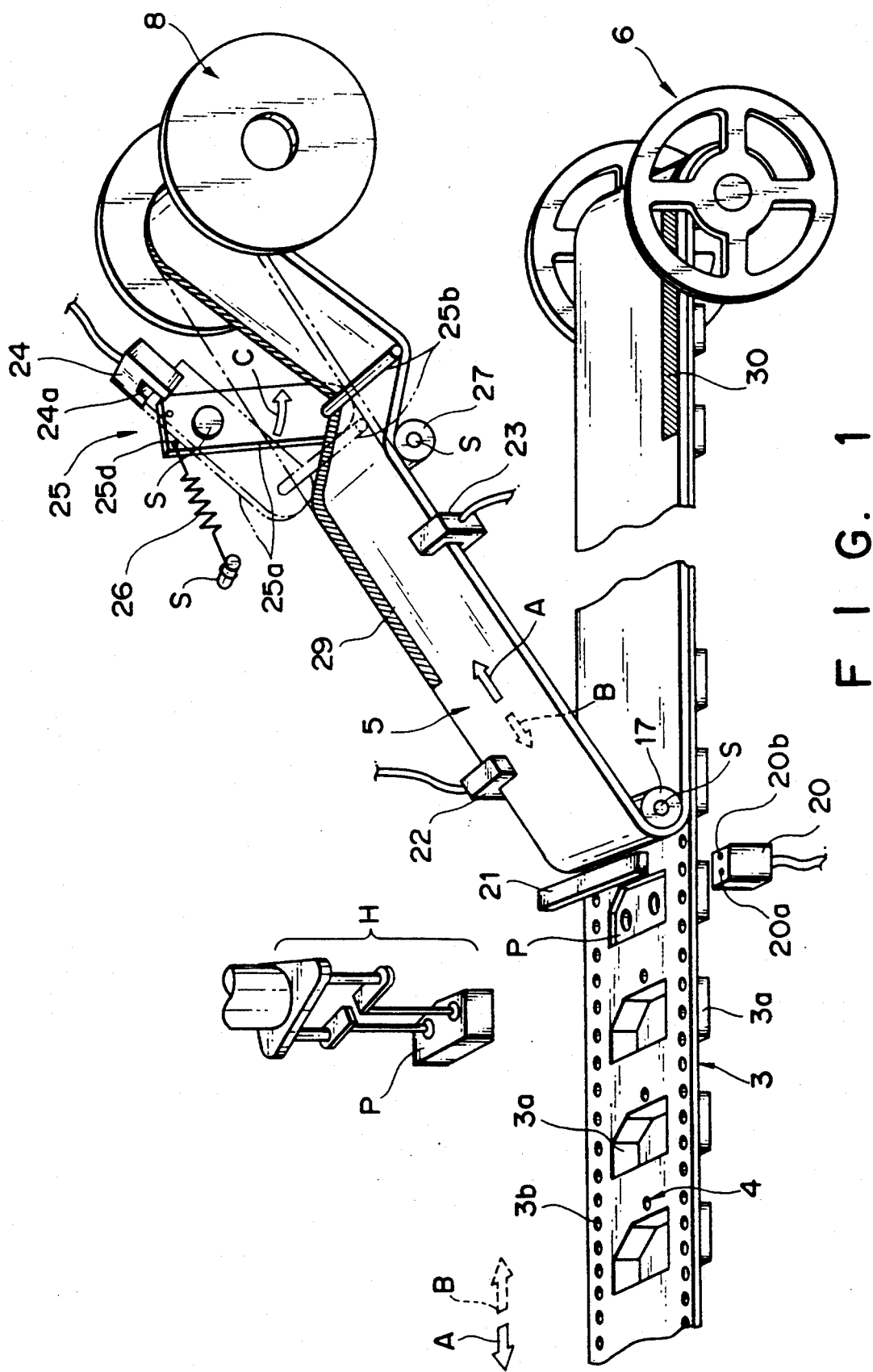
FIG. 1 is a view showing a state wherein parts P are placed on or picked up from a tape to explain a basic principle.

A basic principle for conveying or picking up parts P using a tape will be described below with reference to FIG. 1. As shown in FIG. 1, recess portions 3a having inner dimensions slightly larger than outer dimensions (depth, width, and height) of parts P are successively formed in a conveying tape 3 at equal intervals. Detection holes 4 for allowing light beams emitted from position stop sensors 20 (to be described later) to pass therethrough are formed at equal intervals near the recess portions 3a. Pitch holes 3b are successively formed near two edge portions of the conveying tape 3, and are engaged with a sprocket 12 (to be described later) to transmit a driving force to the conveying tape 3.

A cover tape 5 covers the parts P set in the recess portions 3a, as shown in FIG. 1, thereby holding the positions of the parts P set in the recess portions 3a, and allowing the parts P to be picked up from the recess portions 3a.

More specifically, when the conveying tape 3 and the cover tape 5 are moved in a direction of a broken arrow B in FIG. 1, a part P manufactured by a molding machine is held and moved by a robot hand H, and is set in a recess portion 3a of the conveying tape 3. Thereafter, the upper surface portion of the part P is covered with the cover tape 5. Thereafter, these tapes are taken up by a reel (to be described later).

On the other hand, when the conveying tape 3 is moved in a direction of a solid arrow A, and the cover tape 5 whose direction is changed by a guide roller 17 which is pivotal about a stud S is moved in the direction of the arrow A, the upper surfaces of the parts P are sequentially exposed to the robot hand H, and can be picked upward.

In order to place or feed the parts P as described above, the tapes are taken up by reels, or are fed from the tape, thereby continuously placing or feeding the parts P.

A cover tape take-up reel 8 drives the cover tape 5 in the direction of the solid arrow A in FIG. 1 to take up the cover tape 5, and feeds the cover tape 5 in the direction of the broken arrow B in FIG. 1. The reel 8 is driven by a motor (to be described later). An actuator 25 having a function of preventing the cover tape 5 from being slackened and serving as a tape slack detection means for detecting a slack when the slack of the tape exceeds an allowable range is arranged between the cover tape take-up reel 8 and the guide roller 17.

The actuator 25 comprises a lever portion 25a which is supported to be pivotal about a stud S, and is pivoted from a position indicated by an alternate long and two short dashed line to a position indicated by a solid line in a direction of an arrow C, an arm lever 25b which stands upright on one end of the lever portion 25a, and contacts the rear surface of the cover tape 5 to be pivoted from a position indicated by an alternate long and two short dashed line to a position indicated by a solid line in the direction of the arrow C according to a tension state of the cover tape 5, a spring 26 extending between a hole portion 25d formed in a corner portion of the other end of the lever portion 25a, and a stud S, and a tape slack sensor 24 constituted by a detection portion 24a shielded by the other end of the lever portion 25a. The actuator 25 with this structure is moved in the direction of the arrow C to prevent the cover tape 5 from being slackened, and when a slack exceeds an allowable range, the actuator 25 outputs a slack signal to drive the cover tape take-up reel 8 to take up the tape.

In FIG. 2, the pivot direction of the above-mentioned actuator 25 is reversed, a stopper 28 which contacts the end portion of the lever portion 25a to regulate its pivotal movement is arranged, and the cover tape 5 passes under a guide roller 27.

Other arrangements are the same as those of the actuator 25 shown in FIG. 1, and a detailed description thereof will be omitted. When the actuator 25 is arranged, as shown in FIG. 2, the lever portion 25a shields the detection portion 24a of the tape slack sensor 24 while it contacts the stopper 28, thus allowing more stable detection.

Referring back to FIG. 1, a near-full warning sensor 22 and a near-empty warning sensor 23 are arranged between the guide rollers 17 and 27 to oppose each other and to engage with edges in the widthwise direction of the cover tape 5. The near-full warning sensor 22 detects a detection mark 29 printed near the terminal end of the cover tape 25, while the near-empty warning sensor 23 detects a detection mark 30 printed near the opposite terminal end of the cover tape 5, thereby detecting a placing or pick-up state of parts P.

An origin position stop sensor 20 for detecting the above-mentioned detection holes 4 at a position corresponding to an operation reference position of the robot hand H integrally comprises a light-emitting element 20a and a light-receiving element 20b. A reflection mirror 21 is arranged above the origin position stop sensor 20 to sandwich the conveying tape 3 therebetween. When a light beam emitted from the light-emitting element 20a passes through the detection hole 4, the light beam is reflected by the reflection mirror 21, and is returned to and detected by the light-receiving element 20b. As a result, position detection of the detection hole 4 can be performed. Therefore, the cover tape 5 employs a non-transparent resin material.

FIG. 3 shows a state wherein the detection hole 4 is detected at the position corresponding to the operation reference position of the robot hand H. In FIG. 3, a distance D between a position where a light beam emitted from the light-emitting element 20a of the origin position stop sensor 20 passes through the detection hole 4, is then reflected by the reflection mirror 21, and is detected by the light-receiving element 20b, and the central position of the robot hand H is set, and this position is set as an origin position of the robot hand H to pick up and place parts.

Figure 4:
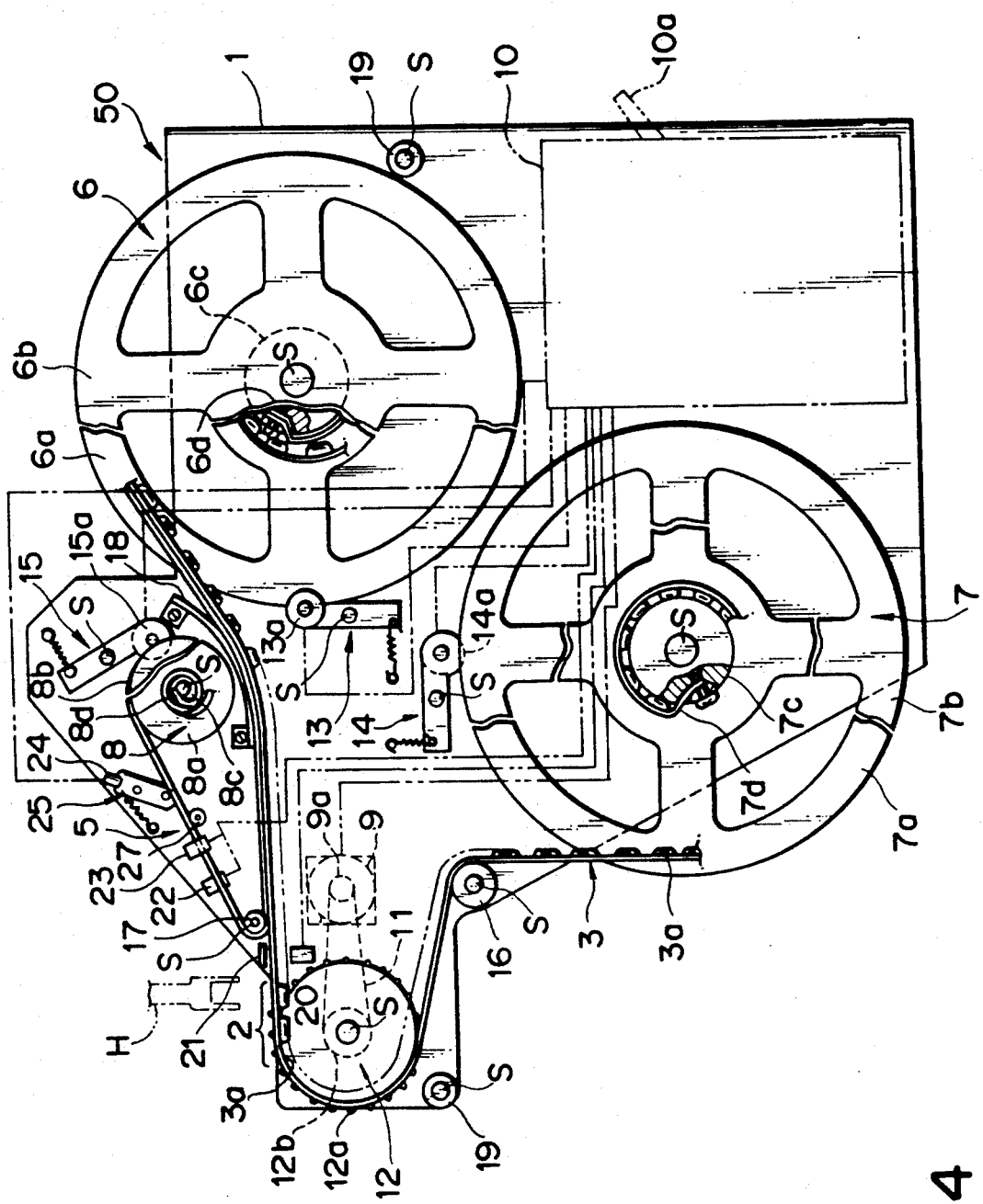
FIG. 4 is a schematic side view showing a structure of a tape type work conveying apparatus 50 according to an embodiment of the present invention.

FIG. 4 is a schematic sectional view showing a structure of a tape type work conveying apparatus 50 according to an embodiment of the present invention, and shows a state wherein the conveying tape 3 and the cover tape 5 are taken up around the reels.

In FIG. 4, a reinforcing member (not shown) is integrally arranged on a base 1 which is obtained by working a planar member into an illustrated shape, so that the base 1 can basically have a mechanical strength large enough to support all the constituting members (to be described below) in a cantilever manner. Studs S stand upright on a frame (not shown) integrally arranged on the base 1, and axially support reels, wheels, and the like to be rotatable and pivotal about them.

As described above, the conveying tape 3 in which parts P are set in its recess portions 3a, and the cover tape 5 are taken up by a parts mounting reel 6, so that the opening portions of the recess portions 3a are covered by the cover tape 5, as shown in FIG. 4. For this purpose, the parts mounting reel 6, the cover tape take-up reel 8 for taking up and feeding the cover tape 5, and a take-up reel 7 for taking up and feeding the conveying tape 3 are pivotal about the studs S.

In rotational central portions 6c, 7c, and 8c of these reels, the tape ends can be fixed by fixing portions 6d, 7d, and 8d, and the tapes are taken up around the outer surfaces of the rotational central portions 6c, 7c, and 8c. These reels respectively have pivot means. Each pivot means is in contact with an outer peripheral edge portion of the corresponding reel to transmit a pivot driving force.

Therefore, the parts mounting reel 6, the tape take-up reel 7, and the cover tape take-up reel 8 respectively have the pivot means for providing a driving force.

Figure 5:
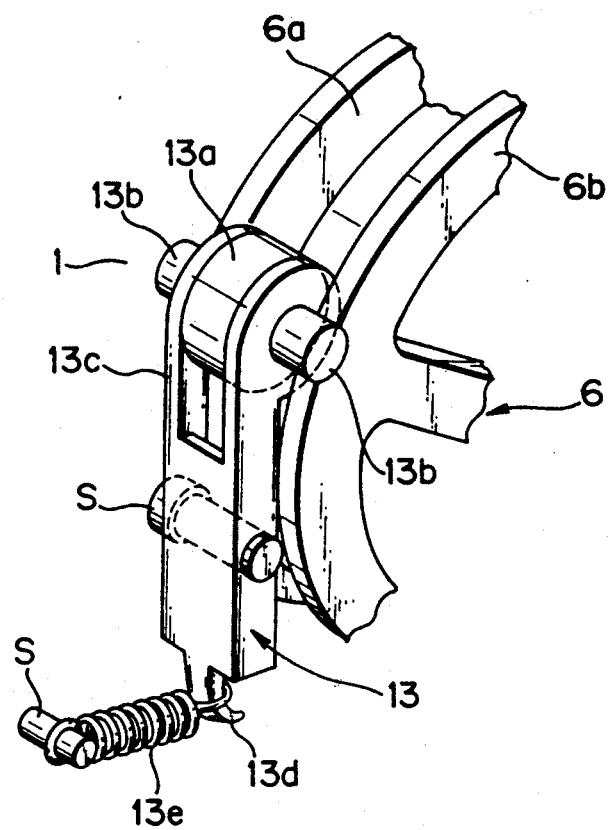
FIG. 5 is a perspective view showing a drive assembly 13 of a parts mounting reel 6 of a pivot means.

In FIG. 5, although the tape take-up reel 7 and the cover tape take-up reel 8 respectively have drive assemblies 14 and 15 having the same arrangement, a drive assembly 13 will be exemplified below, and a description of the drive assemblies 14 and 15 will be omitted.

In FIG. 5, a pair of urethane rubber rollers 13b are respectively fixed to the two ends of an output shaft of a motor 13a for driving the above-mentioned tapes, and causing the tapes to generate tension. The motor 13a is arranged at the distal end portion of an arm member 13c which is axially supported about the stud S standing upright from the base 1, as shown in FIG. 5, so that the outer surfaces of these rubber rollers 13b are urged against outer peripheral edge portions of hubs 6a and 6b of the parts mounting reel 6 at given biasing forces, thereby setting illustrated contact positions.

A tension spring 13e extends between the other end portion 13d of the arm member 13c and the stud S to give a biasing force for pivoting the arm member 13c clockwise in FIG. 5. As a result, the outer surfaces of these rubber rollers 13b are urged against the outer peripheral edge portions of the hubs 6a and 6b of the parts mounting reel 6 at given biasing forces, and are frictionally driven by them.

Referring back to FIG. 4, the motors 13a, 14a, and 15a having the structure described above with reference to FIG. 5 are connected to a controller 10 through wirings, as indicated by alternate long and two short dashed lines, so that the motors 13a, 14a, and 15a perform drive operations, as will be described later.

The controller 10 has a selection switch 10a which is arranged at an externally operable position, and is used to select operation modes (to be described later).

The controller 10 is assembled in the tape type work conveying apparatus 50, as shown in FIG. 4. When the apparatus is set in an assembling apparatus M or a parts manufacturing apparatus N (to be described later), signal and power supply lines are automatically connected to the assembling apparatus M or the parts manufacturing apparatus N.

When the tape type work conveying apparatus 50 is set in the parts manufacturing apparatus N or the assembling apparatus M, a power switch can be automatically turned on, and selection of the operation modes by the above-mentioned selection switch 10a can be automatically performed.

A stepping motor 9 indicated by a broken line in FIG. 4 is connected to the controller 10 through a wiring as indicated by an alternate long and two short dashed line, and is driven under the control of the controller 10. A pivotal driving force of the stepping motor 9 is transmitted, through a belt 11 indicated by a broken line in FIG. 4, to a sprocket gear 12b of the sprocket 12 which is pivotal about the stud S.

Pins 12a to be engaged with the pitch holes 3b of the conveying tape 3 project from the outer surface of the sprocket 12 at equal intervals, so that the conveying tape 3 can be conveyed by the pivotal driving operation of the stepping motor 9. In this embodiment, two sprockets 12 are integrated with the sprocket gear 12b, and are engaged with two arrays of pitch holes 3b of the conveying tape 3.

The above-mentioned origin position stop sensor 20 is arranged near the right side of the two sprockets 12, and the reflection mirror 21 is arranged above the origin position stop sensor 20. The near-full sensor 22 and the near-empty sensor 23 which have been described above with reference to FIG. 1 are arranged between the guide rollers 17 and 27 to clamp the cover tape 5, and are connected to the controller 10. The tape slack sensor 24 which is turned on/off in response to a pivotal operation of the actuator 25 is also connected to the controller 10.

A guide roller 16 which is axially supported to be pivotal about the stud S on the base 1 is arranged to change the conveying direction of the conveying tape 3 from a vertical direction toward the sprockets 12.

The guide roller 17 which is axially supported in the same manner as the guide roller 16 is arranged to change the conveying direction of the cover tape 5 from a direction toward the sprockets 12 to a direction toward the parts mounting reel 6.

A guide rail 18 which is arranged on the base 1, as shown in FIG. 4, and is formed by working a planar member to form an arc is arranged to guide the conveying tape 3 and the cover tape 5 covering the upper surface of the conveying tape 3 along its arcuated outer surface. A pair of cam followers 19 which are axially supported near the right and left edges of the base 1 to be pivotal about the studs S are used as guides for relatively aligning the entire tape type work conveying apparatus 50 when the apparatus 50 is set in the assembling apparatus M or the parts manufacturing apparatus N (to be described later).

Figure 6:
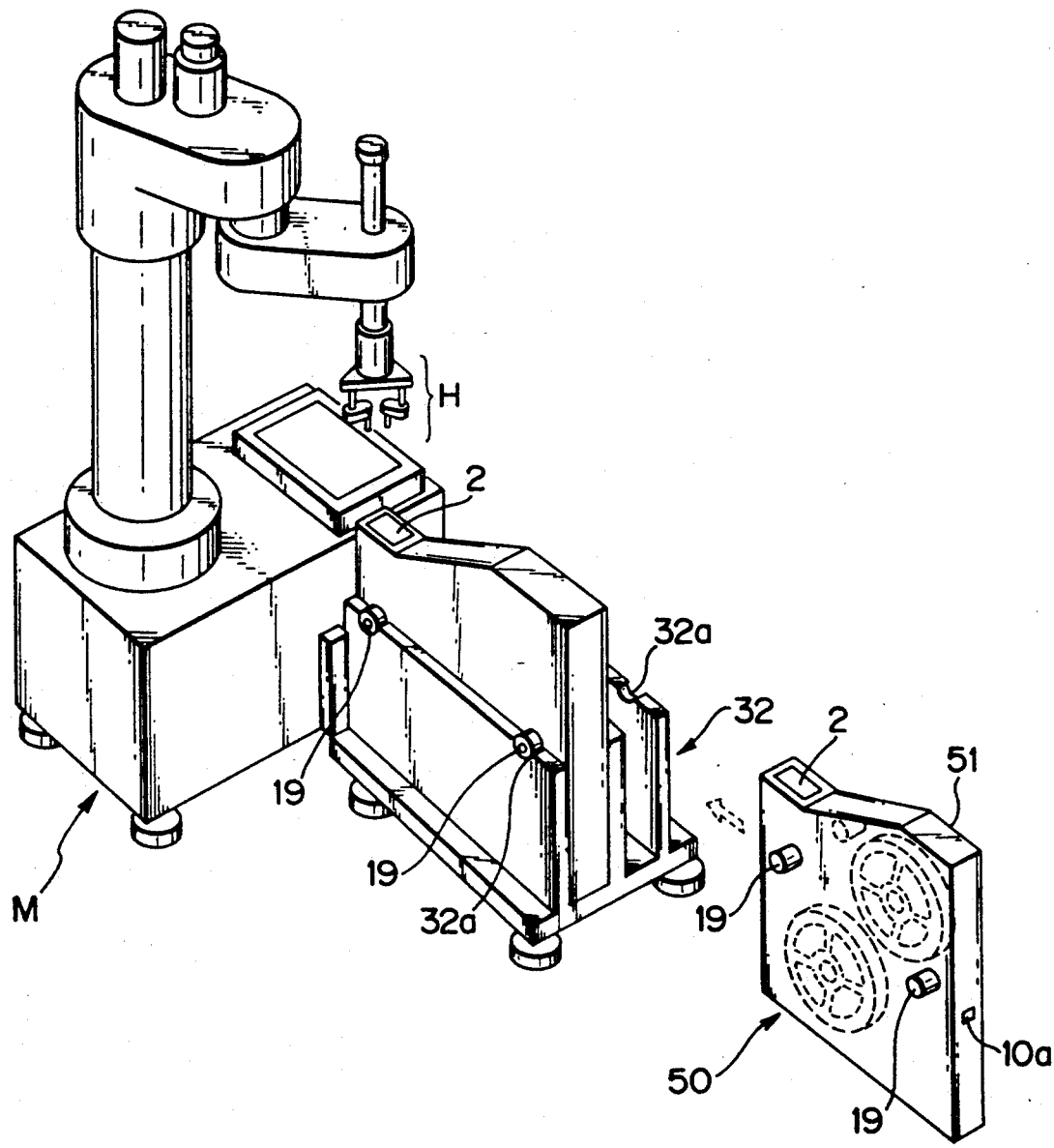
FIG. 6 is a perspective view showing a state wherein the tape type work conveying apparatus 50 is set in an assembling apparatus M comprising the robot hand H.

In FIG. 6 or 7, after the tape type work conveying apparatus 50 is set and inserted in a mounting portion 32 fixed at a predetermined position of the assembling apparatus M or the parts manufacturing apparatus N, the pair of cam followers 19 as the guides for relatively aligning the apparatus 50 are fitted in locking grooves 32a of the mounting portion 32, thereby setting the apparatus 50 at a predetermined position.

The assembling apparatus M or the parts manufacturing apparatus N has the robot hand H. The movement of the robot hand H is completely synchronized with the stepping motor 9, so that the robot hand H places parts P manufactured by the parts manufacturing apparatus N in the recess portions 3a of the conveying tape 3, or picks up the parts P placed in the recess portions 3a of the conveying tape 3 by the assembling apparatus M.

Figure 8:
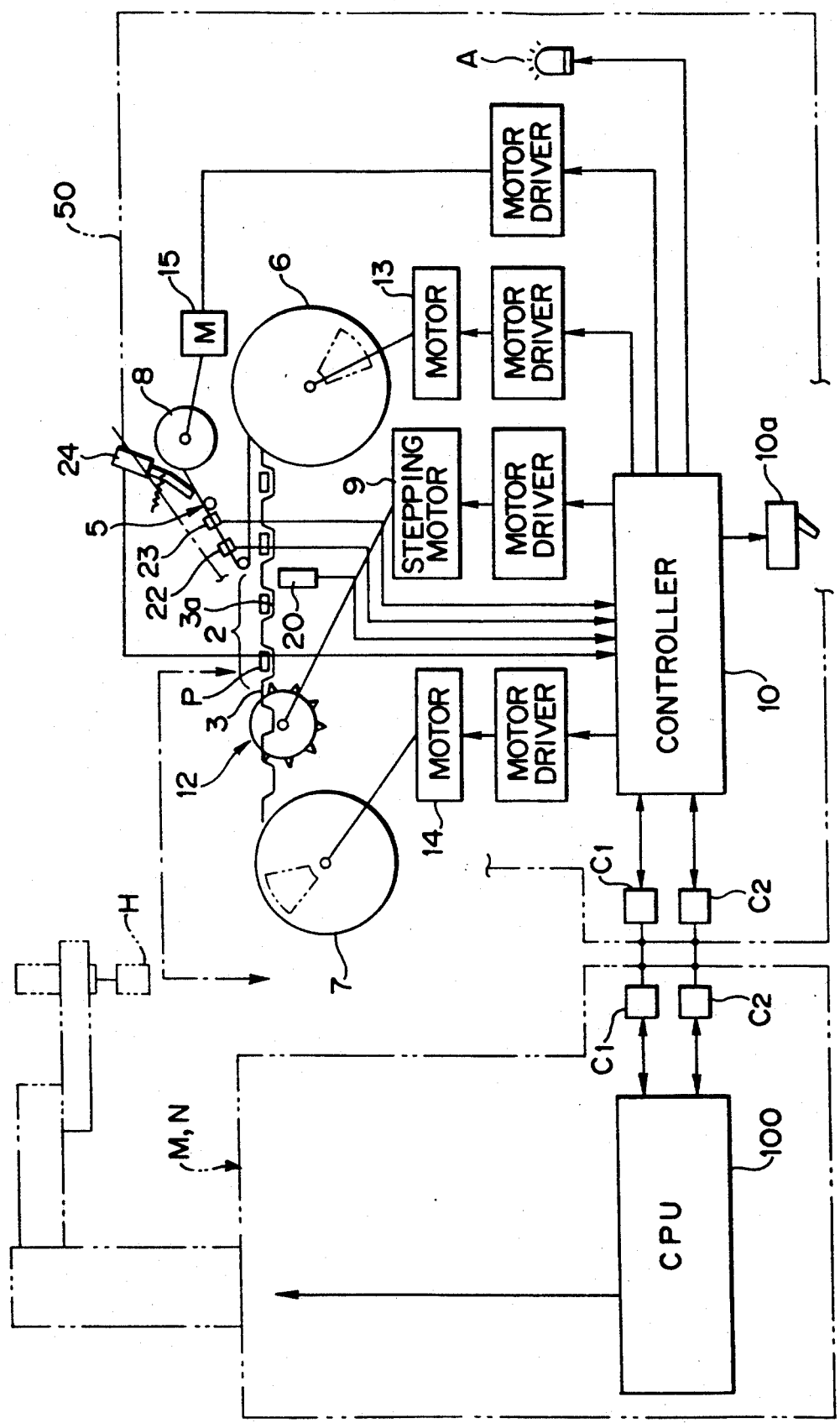
FIG. 8 is a schematic block diagram showing an arrangement of the tape type work conveying apparatus 50.

The block diagram of the tape type work conveying apparatus 50 shown in FIG. 8 illustrates the members and elements connected to the controller 10 with the arrangement as described above with reference to FIG. 4. The same reference numerals in FIG. 8 denote the same parts and elements which have been described with reference to FIG. 4, and a detailed description thereof will be omitted. In FIG. 8, motors and a stepping motor constituting the drive assemblies 13, 14, and 15, and the stepping motor 9 are connected to the controller 10 through corresponding motor drivers for generating a driving voltage current. A warning device A is connected to the controller 10, and signals an abnormality to an operator. Optical connectors $C_2$ and power supply connectors $C_1$, optically connected to a CPU (central processing unit) 100 of the parts manufacturing apparatus N or the assembling apparatus M, for exchanging signals and supplying a power supply voltage are connected to the controller 10.

The operation of the tape type work conveying apparatus 50 with the above-mentioned arrangement will be described below with reference to the flow charts shown in FIGS. 9 and 10.

Figure 9:
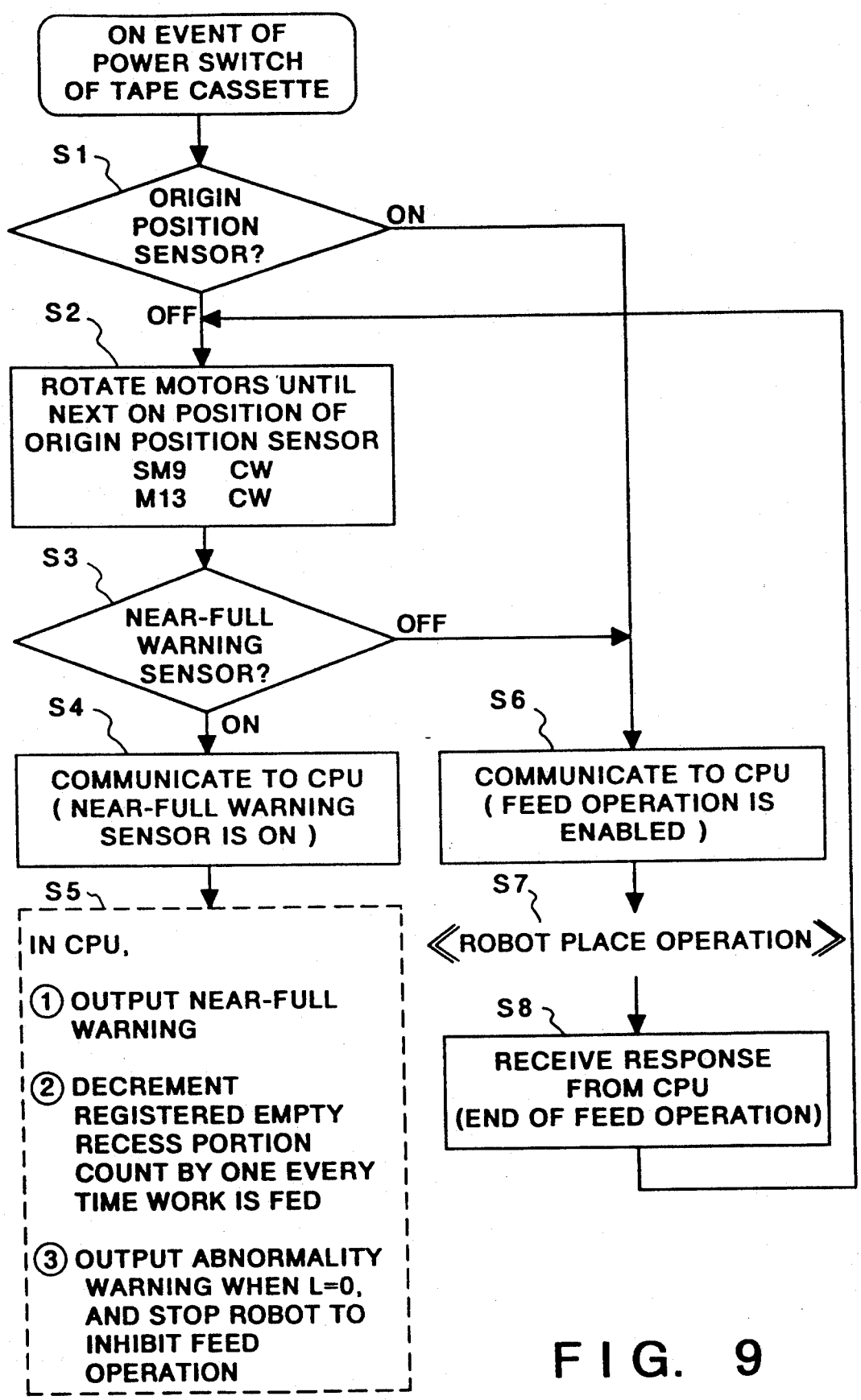
FIGS. 9 and 10 are flow charts for explaining operations of the tape type work conveying apparatus 50.

The flow chart of FIG. 9 shows an operation mode for placing parts P manufactured by the parts manufacturing apparatus N in the conveying tape 3. In a state wherein the cam followers 19 are guided and set in the parts manufacturing apparatus N, the conveying tape 3 is fully taken up around the tape take-up reel 7, and the cover tape 5 is also fully taken up around the cover tape take-up reel 8. As a result, in this state, the detection mark 30 arranged near the terminal end, on the side of the parts mounting reel 6, of the cover tape 5 has been basically detected by the near-empty warning sensor 23.

Therefore, the parts mounting reel 6 is empty, and overlapping end portions of the conveying tape 3 and the cover tape 5 are fixed to the rotational central portion 6c of the parts mounting reel 6. In this state, when the apparatus 50 is set in the parts mounting apparatus N, the switch 10a of the controller 10 is automatically or manually set to a place mode side.

The flow advances to step S1, and an ON/OFF state of the original position stop sensor 20 is checked. If the ON state of the sensor 20 is detected, i.e., if it is determined that the conveying tape 3 reaches an origin position, the flow advances to step S6 to inform to the CPU 100 by communications that a parts place operation can be performed. Thus, the flow advances to step S7, and a part P is placed in the recess portion 3a of the conveying tape 3 by the robot hand H of the parts manufacturing apparatus N. After the place operation, when the controller 10 receives a place completion signal from the CPU 100 in step S8, the flow returns to step S2, and the drive assemblies 13 and 15, and the stepping motor 9 are pivoted to advance the conveying tape 3 and the cover tape 5 in the direction of the broken arrow B in FIG. 1 until the origin position stop sensor 20 is turned on. When the sensor 20 is turned on, the drive operation is stopped, thus setting the next parts place position.

In step S3, an ON/OFF state of the near-full warning sensor 22 is checked. If the OFF state of the sensor 22 is detected, i.e., if it is determined that the terminal end of the conveying tape 3 is not reached yet, the flow advances to step S6 to place a part. Thereafter, the operations in steps S2, S6, S7, and S8 are repetitively executed to fill the parts mounting reel 6.

When the parts mounting reel 6 is nearly full, the detection mark 29 of the cover tape 5 whose terminal end is fixed to the cover tape take-up reel 8 is detected by the near-full warning sensor 22. As a result, the ON state of the sensor 22 is detected in step S3.

If the ON state is detected, the flow advances to step S4 to inform to the CPU 100 by communications that the detection mark 29 of the cover tape 5 is detected by the near-full warning sensor 22. Thereafter, the flow advances to step S5, and (1) a near-full warning is output as a pre-end warning, thereby informing an operator that the place operations of the parts P will end soon. Almost simultaneously with the warning, (2) a remaining count L of the recess portions 3a of the conveying tape 3 is decremented every time parts P are placed. (3) If the remaining count L of the recess portions 3a of the conveying tape 3 becomes zero, an abnormality warning is generated as a true-end warning to inform the operator that the place operations of the parts P are completed. In addition, the place operations of the robot hand H of the parts manufacturing apparatus N are ended and stopped.

In this manner, the parts P are placed directly from the parts manufacturing apparatus N.

When the parts mounting reel 6 fully takes up the tape, the tape type work conveying apparatus 50 is disengaged from the parts manufacturing apparatus N, and is set in the assembling apparatus M comprising the robot hand H shown in FIG. 6 while being guided along the cam followers 19.

The switch 10a of the controller 10 is automatically or manually set to a feed side.

Thereafter, since the drive assemblies 14 and 15, and the stepping motor 9 are respectively pivoted, the parts mounting reel 6, the cover tape take-up reel 8, the tape take-up reel 7, and the sprocket wheels 12 are pivoted, so that the tapes are moved in the direction of the solid arrow A, and the parts P placed in the recess portions 3a of the conveying tape 3 can be picked up by the robot hand H by a pick-up unit 2.

Figure 10:
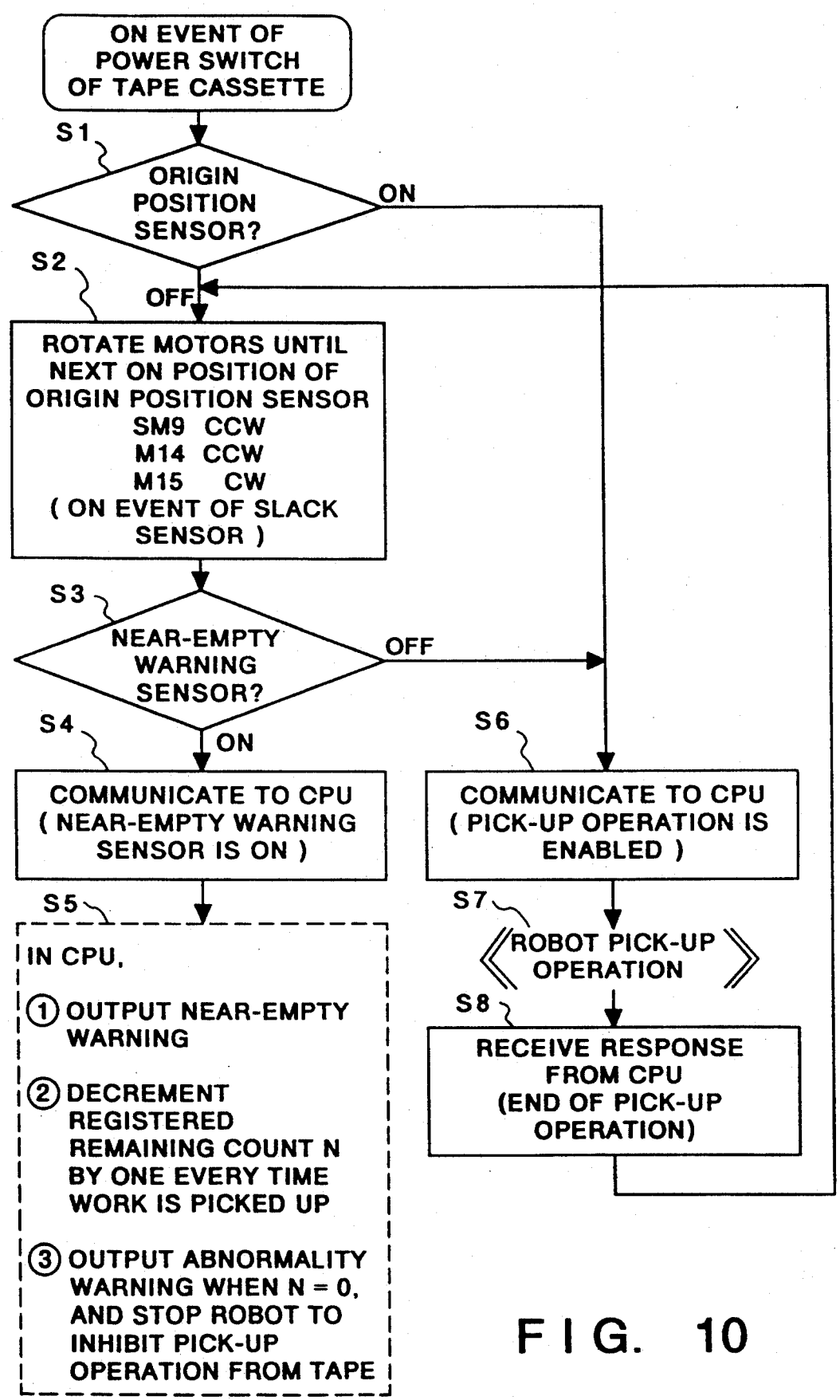

The flow chart of FIG. 10 shows an operation mode for picking up parts P assembled by the parts assembling apparatus M from the conveying tape 3. In FIG. 10, when the apparatus 50 is set in the parts assembling apparatus M, the switch 10a of the controller 10 is automatically or manually set to a pick-up side.

The flow advances to step S1 to check an ON/OFF state of the origin position stop sensor 20. If the ON state of the sensor 20 is detected, i.e., if it is determined that the conveying tape 3 reaches an origin position, the flow advances to step S6 inform to the CPU 100 by communications that a parts pick-up operation can be performed. Thus, the flow advances to step S7, and a part P is picked up from the recess portion 3a of the conveying tape 3 by the robot hand H of the parts assembling apparatus M. After the pick-up operation, when the controller 10 receives a pick-up completion signal from the CPU 100 in step S8, the flow returns to step S2, and the drive assemblies 14 and 15, and the stepping motor 9 are pivoted to advance the conveying tape 3 and the cover tape 5 in the direction of the solid arrow A in FIG. 1 until the origin position stop sensor 20 is turned on. When the sensor 20 is turned on, the drive operation is stopped, thus setting the next parts pick-up position.

When the tape slack sensor 24 for detecting a slack upon a pivot operation of the actuator 25 is turned off, i.e., when the cover tape 5 is slackened, the drive assembly 15 is pivoted clockwise, thus always applying a tension to the cover tape 5.

In step S3, an ON/OFF state of the near-empty warning sensor 23 is checked. If the OFF state of the sensor 23 is detected, i.e., if it is determined that the conveying tape 3 does not reach its terminal end yet, the flow advances to step S6 described above to pick up parts. The operations in steps S2, S6, S7, and S8 are repetitively executed to pick up parts P from the parts mounting reel 6.

When parts on the parts mounting reel 6 run short, the detection mark 30 of the cover tape 5 whose terminal end is fixed to the cover tape take-up reel 8 is detected by the near-empty warning sensor 23. As a result, the ON state of the sensor 23 is detected in step S3.

When the ON state of the sensor 23 is detected, the flow advances to step S4 to inform the CPU 100 by communications that the detection mark 30 of the cover tape 5 is detected by the near-empty warning sensor 23. Thereafter, the flow advances to step S5, and (1) a near-empty warning is output as a pre-end warning, thus informing an operator that the pick-up operations of the parts P will be ended soon. Almost simultaneously with this warning, (2) a registered remaining count N of the recess portions 3a of the conveying tape 3 is decremented every time the parts P are picked up. In step S5, (3) when the registered remaining count N of the recess portions 3a of the conveying tape 3 becomes zero, an abnormality warning is output as a true-end warning, thus informing the operator that the pick-up operations of the parts P are ended. In addition, the pick-up operations of the robot hand H of the parts assembling apparatus M are ended, and the apparatus is stopped.

In this manner, the parts P are picked up from the tape type work conveying apparatus 50 to the parts assembling apparatus M.

Upon repetition of the above-mentioned operations, parts P manufactured by the parts manufacturing apparatus N are fed to the assembling apparatus M. When a large number of tape type work conveying apparatuses are prepared, working efficiency of the assembling apparatus M and the parts manufacturing apparatus N can be increased.

In the above embodiment, the controller 10 is assembled in the tape type work conveying apparatus 50, and when the apparatus 50 is set in the assembling apparatus M or the parts manufacturing apparatus N, signal lines are automatically connected. However, the controller 10 may be an independent one.

As described above, since parts to be assembled are conveyed by a tape provided with recess portions having a shape matching with the parts, the parts to be assembled can be precisely positioned when they are placed or picked up. In addition, conveying/feeding operations of small parts which are considerably difficult in a conventional system can be easily automated using, e.g., robots.

Since the conveying tape and the cover tape are taken up without using an adhesive, they can be repetitively used semipermanently. Therefore, the tapes need not be exchanged, and running cost can be greatly reduced.

Since the tape slack sensor 24 which is operated in response to the actuator 25 is used in addition to the driving stepping motor 9, and the drive assemblies 13, 14, and 15, a tape take-up error due to, e.g., a slack of the tape, and problems such as dropping of parts P can be eliminated.

Furthermore, a tape drive unit may be arranged outside the tape type work conveying apparatus 50, and may be commonly used.

In the above embodiment, the parts P have a box-like shape. However, the apparatus of the present invention can be applied to parts having any other shapes as long as the recess portions 3a of the conveying tape 3 are formed to precisely align parts P. A corner portion of the bottom surface of each recess portion 3a may be detected in place of the detection hole 4, or a reflection tape may be arranged in place of the detection hole 4, and the reflection mirror 21 may be omitted.

As described above, according to the tape type work conveying method and apparatus of the present invention, an arrangement for performing tape drive control and work count control necessary for picking up and placing works can be realized at low cost.

A tape type work conveying apparatus which can be automatically started after a power switch is turned on can be realized at low cost.

Since control is made to prevent the cover tape from being slackened, the cover tape will never be slackened.

As many apparently widely different embodiments of the present invention can be made without departing from the spirit and scope thereof, it is to be understood that the invention is not limited to the specific embodiments thereof except as defined in the appended claims.

What is claimed is:

1. A method for operating a workpiece handling apparatus having a main controller and a robot hand and being interconnected to a tape conveying apparatus with the tape conveying apparatus having a conveying tape with a plurality of successive placing portions for placing and conveying workpieces, a cover tape for covering openings of the placing portions on the conveying tape, a first reel for fixing end portions of the conveying tape and the cover tape and simulatneously taking up the conveying tape and the cover tape, a second reel for fixing an end portion of the conveying tape and taking up only the conveying tape, a third reel for fixing an end portion of the cover tape and taking up only said cover tape, drive assemblies for rotatably driving the first, second, and third reels, an intermittent driver for intermittently driving the conveying tape, a controller for controlling the driver assemblies and the intermittent driver, a first detector for detecting indicating portions on the conveying tape to indicate the placing portions, and a guiding mechanism for interconnecting the workpiece handling apparatus and the tape conveying apparatus, said method comprising the steps of:
   interconnecting the workpiece handling apparatus and the tape conveying apparatus together;
   connecting the main controller of the workpiece handling apparatus and the controller of the tape conveying apparatus;
   winding the conveying tape and cover tape;
   detecting the indicating portions on the conveying tape with the first detector to determine the placing portions on the conveying tape;
   manipulating the robot hand to pick up or place workpieces in the placing portions on the conveying tape;
   synchronizing the mainpulating step with movement of the placing portions to precisely pick up or place the workpieces in the placing portions based on the detecting indicating portions;
   driving the first reel and the intermittent driver on the basis of the detection result from the first detector when the workpieces are manipulated after the tape conveying apparatus is guided and positioned with respect to the workpiece handling apparatus; and
   detecting with a second detector a detection member arranged near an end portion of the cover tape fixed to the third reel for indicating that the conveying tape is almost full of workpieces.

2. The method according to claim 1, further including the steps of outputting a warning to the main controller on the basis of the detection by the second detector, counting the empty placing portions remaining on the conveying tape, and stopping the tape conveying apparatus when the remaining count of the placing portions becomes zero.

3. A method for operating a workpiece handling apparatus having a main controller and a robot hand and being interconnected to a tape conveying apparatus with the tape conveying apparatus having a conveying tape with a plurality of successive placing portions for placing and conveying workpieces, a cover tape for covering openings of the placing portions on the conveying tape, a first reel for fixing end portions of the conveying tape and the cover tape and simultaneously taking up the conveying tape and the cover tape, a second reel for fixing an end portion of the conveying tape and taking up only the conveying tape, a third reel for fixing an end portion of the cover tape and taking up only said cover tape, drive assemblies for rotatably driving the first, second, and third reels, an intermittent driver for intermittently driving the conveying tape, a controller for controlling the driver assemblies and the intermittent driver, a first detector for detecting indicating portions on the conveying tape to indicate the placing portions, and a guiding mechanism for interconnecting the workpiece handling apparatus and the tape conveying apparatus, said method comprising the steps of:
   interconnecting the workpiece handling apparatus and the tape conveying apparatus together;
   connecting the main controller of the workpiece handling apparatus and the controller of the tape conveying apparatus;
   winding the conveying tape and cover tape;
   detecting the indicating portions on the conveying tape with the first detector to determine the placing portions on the conveying tape;
   manipulating the robot hand to pick up or place workpieces in the placing portions on the conveying tape;
   synchronizing the mainpulating step with movement of the placing portions to precisely pick up or place the workpieces in the placing portions based on the detecting indicating portions;
   driving the second reel and the intermittent driver on the basis of the detection result from the first detector when the workpiece in the placing portions are placed in the parts handling apparatus after the tape conveying apparatus is guided and positioned with respect to the parts handling apparatus; and
   detecting with a third detector a detection member arranged on an end portion of the cover tape fixed to the first reel for indicating that remaining count of workpieces on the conveying tape is small.

4. The method according to claim 3, further including the steps of detecting slack in the cover tape, and driving the drive assembly of the third reel on the basis of detected slack in the cover tape.

5. The method according to claim 4, further including the steps of outputting a warning signal to the main controller based on the detection by the third detector, counting the placing portions on the conveying tape occupied by workpieces, and stopping the handling apparatus when the remaining count of occupied placing portions becomes zero.

6. A tape-type workpiece conveying apparatus comprising:
   a workpiece handling apparatus having means for assembling or manufacturing workpieces, said workpiece handling apparatus having a main controller and a robot hand for manipulating the workpieces;
   a tape conveying apparatus comprising a conveying tape having a plurality of successive placing portions for placing and conveying works, a cover tape for covering openings of the placing portions of said conveying tape, a first reel for fixing end portions of said conveying tape and said cover tape and simultaneously taking up said conveying tape and said cover tape, a second reel for fixing an end portion of said conveying tape and taking up only said conveying tape, a third reel for fixing an end portion of said cover tape and taking up only said cover tape, driving means for rotatably driving said first, second and third reels and winding said cover tape and said conveying tape, intermittent drive means for intermittently driving said conveying tape, control means for controlling said driving means and said intermittent drive means, first detection means for detecting indicating portions on said conveying tape to indicate the placing portions, and guiding means for interconnecting said tape conveying apparatus with said workpiece handling apapratus;

second detection means for detecting a detection member arranged near an end portion of said cover tape fixed to said third reel and indicating that said conveying tape is almost full of workpieces;

third detection means for detecting a detection member arranged on an end portion of said cover tape which is integrally fixed to said conveying tape, and indicating that the amount of workpieces remaining on said conveying tape is small; and warning means connected to said second and third detection means for warning an operator of the results of said second and third detecting means; wherein said main controller is connected to said control means and the workpieces are manipulated by said robot hand in synchronism with movement of the placing portions of said conveying tape as detected by said first detection means.

7. The apparatus according to claim 6, wherein said placing portions of said conveying tape comprise recess portions integrally formed with said conveying tape in correspondence with outer shapes of the workpieces.

8. The apparatus according to claim 6, wherein said indicating portions are holes formed near the recess portions, and said first detection means comprises an optical sensor for detecting the holes.

9. The apparatus according to claim 6, wherein said cover tape is formed of a non-transparent resin material.

10. The apparatus according to claim 6, wherein said first detection means detects the indicating portions arranged substantially at the same intervals as said placing portions, and detects an origin position.

11. The apparatus according to claim 6, wherein said second and third detection means are arranged to oppose each other in a widthwise direction of said cover tape, and are arranged between said third reel and an opening surface portion where said conveying tape and said cover tape are adhered together.

* * * * *

UNITED STATES PATENT AND TRADEMARK OFFICE
CERTIFICATE OF CORRECTION

PATENT NO. : 5,191,693

DATED : March 9, 1993

INVENTOR(S) : Sachio Umetsu

It is certified that error appears in the above-identified patent and that said Letters Patent is hereby corrected as shown below:

<u>COLUMN 11</u>

Line 43, "mainpulating" should read --manipulating--.

Signed and Sealed this

Fifteenth Day of February, 1994

Attest:

BRUCE LEHMAN

*Attesting Officer*     *Commissioner of Patents and Trademarks*